United States Patent [19]

Tsuchida et al.

[11] Patent Number: 4,965,867
[45] Date of Patent: Oct. 23, 1990

[54] OFFSET COMPENSATION CIRCUIT

[75] Inventors: Masami Tsuchida; Ichiro Miyake; Tokihiro Takahashi; Shinichi Wakumura, all of Saitama; Yoshimi Iso, Kanagawa; Takao Arai, Kanagawa; Hiroo Okamoto, Kanagawa, all of Japan

[73] Assignees: Pioneer Electronic Corporation; Hitachi, Ltd., both of Tokyo, Japan

[21] Appl. No.: 234,874

[22] Filed: Aug. 22, 1988

[30] Foreign Application Priority Data

| Aug. 20, 1987 | [JP] | Japan | 62-205031 |
| Aug. 20, 1987 | [JP] | Japan | 62-205032 |
| Aug. 20, 1987 | [JP] | Japan | 62-205033 |
| Aug. 26, 1987 | [JP] | Japan | 62-210144 |

[51] Int. Cl.$^5$ .................................................. H03M 1/06
[52] U.S. Cl. ................................ 341/118; 341/143
[58] Field of Search ........... 341/108, 115, 118, 143; 330/9; 364/571

[56] References Cited

U.S. PATENT DOCUMENTS

| 3,925,731 | 12/1975 | Brainard et al. | 341/143 |
| 3,940,759 | 2/1976 | Zitelli et al. | 341/118 |
| 4,025,852 | 5/1977 | Ching | 341/143 |
| 4,097,860 | 6/1978 | Araseki et al. | 341/118 |
| 4,164,733 | 8/1979 | Landsburg et al. | 341/118 |
| 4,229,703 | 10/1980 | Bustin | 341/118 |
| 4,313,204 | 1/1982 | DeFreitas | 341/143 |
| 4,371,972 | 2/1983 | Schwarz et al. | 341/143 |
| 4,380,005 | 4/1983 | Debord et al. | 341/118 |
| 4,590,458 | 5/1986 | Evans et al. | 341/118 |
| 4,633,196 | 12/1986 | Peled et al. | 341/143 |
| 4,766,417 | 8/1988 | Takayama et al. | 341/118 |
| 4,792,787 | 12/1988 | Speiser et al. | 375/27 |
| 4,805,192 | 2/1989 | Confalonieri et al. | 341/118 |
| 4,811,019 | 3/1989 | Julstrom et al. | 341/143 |

Primary Examiner—William M. Shoop, Jr.
Assistant Examiner—Marc S. Hoff
Attorney, Agent, or Firm—Sughrue, Mion, Zinn, Macpeak & Seas

[57] ABSTRACT

An offset compensation circuit for compensating a DC offset which occurs in a circuit line including an A/D converter or an A/D and D/A converter in which not only the polarity bit of digital data but also information concerning the amplitude of an analog input signal are applied to an integrator to precisely compensate an offset voltage in a circuit line. The level of a proper offset compensation voltage is provided even when an input analog signal such as a music signal is absent, and when an A/D and D/A converter is provided which can perform both A/D conversion and D/A conversion the DC offset can be precisely compensated shortly after the change of the mode from D/A conversion to A/D conversion.

23 Claims, 10 Drawing Sheets

OFFSET COMPENSATION CIRCUIT

BACKGROUND OF THE INVENTION

The present invention relates to an offset compensation circuit for compensating a DC offset which occurs in a circuit line including an A/D converter or an A/D and D/A converter.

FIG. 1 shows a block diagram of a conventional offset compensation circuit for a circuit line including an A/D converter 1 which changes an analog input signal IN into a digital output signal OUT. The offset compensation circuit includes a most significant bit latch circuit 2 which detects only the polarity bit of the digital output signal OUT from the A/D converter, an integrator 3 which integrates only the polarity bit detected by the most significant bit latch circuit 2 and produces an offset compensation voltage $V_{CMP}$, and a filter 4 which band limits the analog input signal IN to allow only a prescribed band of components thereof to pass through the filter 4 and enter into the A/D converter 1. For example, the filter 4 includes an active filter employing an operational amplifier. The offset compensation voltage $V_{CMP}$ is supplied from the integrator 3 to the input terminal of the operational amplifier to achieve feedback to the circuit line, equalizing the probability of the positive and negative polarities of the digital output signal OUT to each other. As a result, the offset in the digital output signal OUT is automatically compensated by the configuration shown in FIG. 1.

When a music signal shown in FIG. 2(a) is applied as the analog input signal to the circuit line shown in FIG. 1, positive and negative polarity bits shown in FIG. 2(b) are output from the most significant bit latch circuit 2. Since the probability of the positive polarity of the music signal and that of the negative polarity thereof are statistically equal to each other in general, the offset in the digital output signal is compensated by performing feedback using the polarity bits shown in FIG. 2(b). When the analog input signal IN is absent, feedback is performed so that the digital output signal OUT changes between the positive minimum and negative minimum values. However, since the constitution of the conventional offset compensation circuit is such that the most significant bit is detected from the digital output signal to perform the feedback, the operation of the circuit differs depending on the analog input signal. In other words, if the offset is present at the time of absence of the analog input signal, the most significant bit is fixed at the positive or negative polarity to achieve feedback. However, when a sine wave sin ($V_{IN}=A_1\sin\omega t$) with large amplitude as shown in FIG. 3(a) is applied as the analog input signal to the circuit line, the polarity bit (the most significant bit) becomes positive and negative alternately as shown in FIG. 3(b), and a problem occurs that the loop gain of the circuit line and the offset compensation circuit decreases depending on the wave form and amplitude of the input signal. When it is supposed that a 10 mV offset occurs with regard to an input sine wave of $4V_{P-P}$ in amplitude, the loop gain of the circuit line and the offset compensation circuit decreases by about 50 dB in comparison with the case where the input signal is absent. Shown in FIG. 3(c) is the polarity bit for an input sine wave ($V_{IN}=A_2\sin\omega t$) of small amplitude. The quantity of the change in the loop gain is determined as $$\frac{T_H - T_L}{T}$$

in the cases shown in FIG. 3.

Although the probability of the positive polarity of the music signal and that of the negative polarity thereof are statistically equal to each other in general, they are not always equal to each other within a short period of time. For that reason, it is difficult to set the time constant of the integrator 3. If the time constant of the integrator 3 is set to be small, the response is faster but the offset compensation circuit itself acts to cause an offset depending on the wave form of the music signal within a short period of time. This is because the probabilities of the positive and negative polarities of the sound of a given kind of musical instrument are not equal to each other and as a result the offset compensation circuit operates improperly to produce an output even if the circuit line has no offset.

FIG. 4(a) shows an example of the analog input signal to the circuit line. FIG. 4(b) shows the output signal from the integrator 3. FIG. 4(c) shows the residual offset of the A/D converter 1. When the analog input signal is absent, the level of the offset compensation voltage sent out from the integrator 3 is proper. However, when the music signal is applied as the analog input signal IN to the circuit line, the loop gain decreases as mentioned above, so that the level of the offset compensation voltage drops as shown in FIG. 4(b).

FIG. 5 shows a block diagram of another conventional offset compensation circuit for a circuit line including an A/D and D/A converter 6 which can perform both A/D conversion and D/A conversion. The offset compensation circuit includes an integrator 3 and a filter 4 which are the same as those of the circuit shown in FIG. 1, a switch 5 which is shifted for the A/D conversion or the D/A conversion, a digital detector 7 made of a most significant bit latch circuit which detects only the polarity bit of the digital output signal from the converter 6 as in the offset compensation circuit shown in FIG. 1, and a signal processing section 8 made of a digital signal processor or the like to perform signal processing along with the A/D conversion or the D/A conversion. In the mode of the A/D conversion, the switch 5 is connected at a contact a so that an analog input signal is supplied to the A/D and D/A converter 6 through the filter 4 and changed into the digital output signal by the A/D converting section of the converter. The signal processing section 8 performs necessary processing on the digital signal. The digital signal is supplied to the integrator 3 through the digital detector 7 and integrated so that the integrator sends out an offset compensation voltage $V_{CMP}$ which is fed back to the filter 4 to compensate an offset in the circuit line. An analog output signal is sent out from the filter to a monitoring output terminal. In the D/A conversion mode, the switch 5 is connected at another contact b, and a digital signal subjected to necessary processing by the signal processing section 8 is changed into an analog signal by the D/A converting section of the A/D and D/A converter 6. The digital signal is supplied to the filter 4 through the contact b of the switch, and a D/A conversion output signal is sent out from the filter 4 to the monitoring output terminal. The digital signal from the signal processing section 8 in this mode is also supplied to the digital detector 7, and the output is supplied to the integrator 3, the output of which is supplied to the filter 4 thus creating feedback. Since the output from the integrator 3 in the D/A mode is determined by digital data applied to the A/D and D/A converter 6 but is independent of the offset voltage in the converter 6, the D/A conversion output signal undergoes a time fluctuation or the like. Although the output from the digital detector 7 can be fixed at a duty factor of 50%, for example, in the D/A conversion mode to cope with the fact that the output from the integrator 3 in this mode is independent of the offset voltage in the converter 6, there is still a problem that the compensation of the offset at the start of the A/D conversion mode is not precisely performed because of the presence of the output from the integrator 3 when the D/A conversion mode is changed to an A/D conversion mode.

FIG. 6(a) shows the mode conversion by the A/D and D/A converter 6. FIG. 6(b) shows the output from the digital detector 7. FIG. 6(c) shows the output from the integrator 3 in the A/D conversion mode and the D/A conversion mode. In the A/D conversion mode, the output from the integrator 3 is the offset compensation voltage based on the polarity bit (most significant bit), for example, obtained by the digital detector 7, and is fed back to compensate the offset. When the offset compensation voltage is positive or negative as shown in FIG. 6(c), the offset in the circuit line has a negative or positive quantity, respectively, equal in magnitude to the offset compensation voltage.

When the A/D and D/A converter is in the D/A conversion mode, a signal of 50% in duty factor is applied to the input terminal of the integrator 3 independently of the digital data. However, even if the duty factor of the signal deviates only slightly from 50%, the output voltage of the integrator 3 rises to a level substantially equal to the voltage of a power supply for an amplifier included in the integrator 3. If the duty factor of the digital data is 50% in that case, the positive and negative magnitudes of the D/A conversion output signal are equal to each other. However, if the duty factor of the digital data deviates even slightly from 50% an error occurs. The output voltage of the integrator 3 drops close to 0 V when a change from the D/A conversion mode to the A/D conversion mode occurs, so that it takes a relatively long time for the integrator 3 to send out a proper offset compensation voltage. For that reason, the compensation of the offset cannot be precisely performed during a period $t_1$ (shown in FIG. 6(c)) at the start of the A/D conversion mode.

The offset adjustment of the A/D converter 1 shown in FIG. 1 also needs to be performed precisely so that the digital output code is zero in a non-servo state established by opening the feedback loop of the offset compensation circuit and the circuit line. However, the offset compensation circuit is configured so that digital data obtained as a result of the A/D converting action of the A/D converter 1 and the subsequent detecting action of the most significant bit latch circuit 2 are integrated by the integrator 3 to produce the offset compensation voltage $V_{CMP}$ which is fed back to the circuit line through the analog signal input terminal of the filter 4 to compensate the offset in the A/D converter. For that reason, the feedback loop remains formed at the time of the offset adjustment of the A/D converter 1 so that a servo state is established to ensure the offset is always zero. As a result, it is difficult to precisely perform the offset adjustment of the A/D converter 1.

SUMMARY OF THE INVENTION

The present invention was made in order to eliminate the above-mentioned problems and drawbacks of the conventional offset compensation circuits.

Accordingly, it is an object of the present invention to provide an offset compensation circuit in which not only the polarity bit of digital data but also information concerning the amplitude of an analog input signal are applied to an integrator to precisely compensate an offset voltage in a circuit line. The plural most significant bits of a digital signal obtained through the A/D conversion of the analog input signal are weighted so that a control signal for eliminating the offset voltage is produced. An offset compensation voltage obtained by integrating the control signal is subjected to negative feedback to the analog signal section of an A/D converter to compensate the offset voltage therein on the basis of the control signal including not only the polarity bit of the digital data but also the information concerning the amplitude of the analog input signal. Since the control signal includes not only the polarity bit o the digital data but also the information concerning the amplitude of the analog input signal, the loop gain of the offset compensation circuit and the circuit line is prevented from decreasing when the analog input signal is applied to the circuit line. The offset voltage in the circuit line is precisely compensated even if the positive and negative wave forms of the analog input signal are not symmetric to each other, or if the probability of the positive polarity of the analog input signal and that of the negative polarity thereof are not equal to each other.

It is another object of the present invention to provide an offset compensation circuit in which the level of a proper offset compensation voltage when an input analog signal such as a music signal is absent is stored in a memory, so that when an analog input signal is applied to a circuit line including an A/D converter, an offset voltage in the circuit line is precisely compensated on the basis of the level stored in the memory. The offset compensation circuit includes the memory, an integrator, and a switch. The integrator integrates the fluctuation in a digital signal produced from the analog input signal by the A/D converting action of the A/D converter and sends out the offset compensation voltage. The level of the proper offset compensation voltage, when the analog input signal is absent, is stored in the memory, as mentioned above. The level stored in the memory or the output directly from the integrator is selected by the switch so as to be fed back to the analog signal section of the A/D converter. As a result, the offset voltage in the circuit line is precisely compensated when the analog input signal is applied as well as when it is absent.

It is yet another object of the present invention to provide an offset compensation circuit by which an offset voltage in a circuit line including an A/D and D/A converter which can perform both A/D conversion and D/A conversion can be precisely compensated shortly after the change of the mode from D/A conversion to A/D conversion. The offset compensation circuit includes an integrator which integrates the fluctuation in a digital signal and sends out an offset compensation voltage from the integrator to the analog signal input terminal of the A/D and D/A converter, and a means for inhibiting the operation of the integrator in the D/A conversion mode so that a value independent of the offset voltage in the circuit line is prevented from being fed back from the integrator to the circuit line in the D/A conversion mode.

It is yet another object of the present invention to provide an offset compensation circuit in which a changeover means for opening the feedback loop of the offset compensation circuit and a circuit line at the time of the offset adjustment of an A/D converter included in the circuit line is provided so that the changeover means is shifted to establish a non-servo state and thus precisely perform the offset adjustment of the converter. Digital data from the A/D converter or other digital data are selected by the changeover means so that an offset compensation voltage is produced by an integrator on the basis of the digital data from the A/D converter or the other digital data. At the time of the offset adjustment of the A/D converter, the changeover means is shifted to open the feedback loop and establish the non-servo state and thus precisely perform the offset adjustment of the converter on the basis of the other digital data. An A/D and D/A converter which can perform both A/D conversion and D/A conversion may be included in the circuit line instead of the A/D converter. If the A/D and D/A converter is included in the circuit line instead of the A/D converter, the other digital data are supplied to the integrator through the shifting of the changeover means in the D/A conversion mode to always keep the level of the output from the integrator constant so as to perform the offset adjustment of the converter in a simple and precise manner.

DETAILED DESCRIPTION OF THE PREFERRED EMBODIMENTS

Embodiments of the present invention are hereafter described in detail with reference to the attached drawings hereto.

Figure 1:
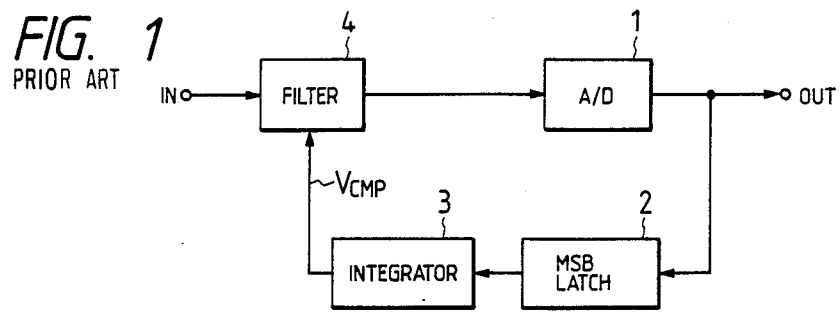
FIG. 1 shows a block diagram of a conventional offset compensation circuit for a circuit line including an A/D converter.
Figure 2:
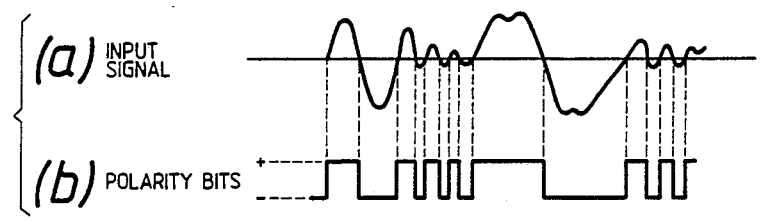
FIG. 2 shows an example of the polarity bit in the conventional offset compensation circuit.
Figure 3:
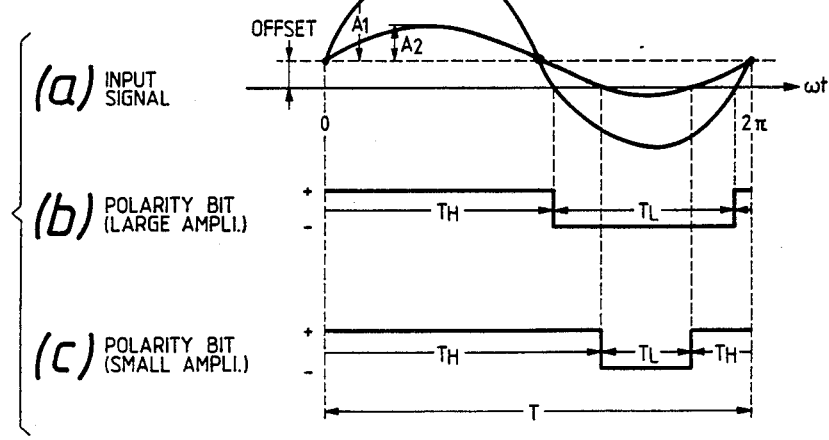
FIG. 3 shows another example of the polarity bit in the conventional offset compensation circuit.
Figure 4:
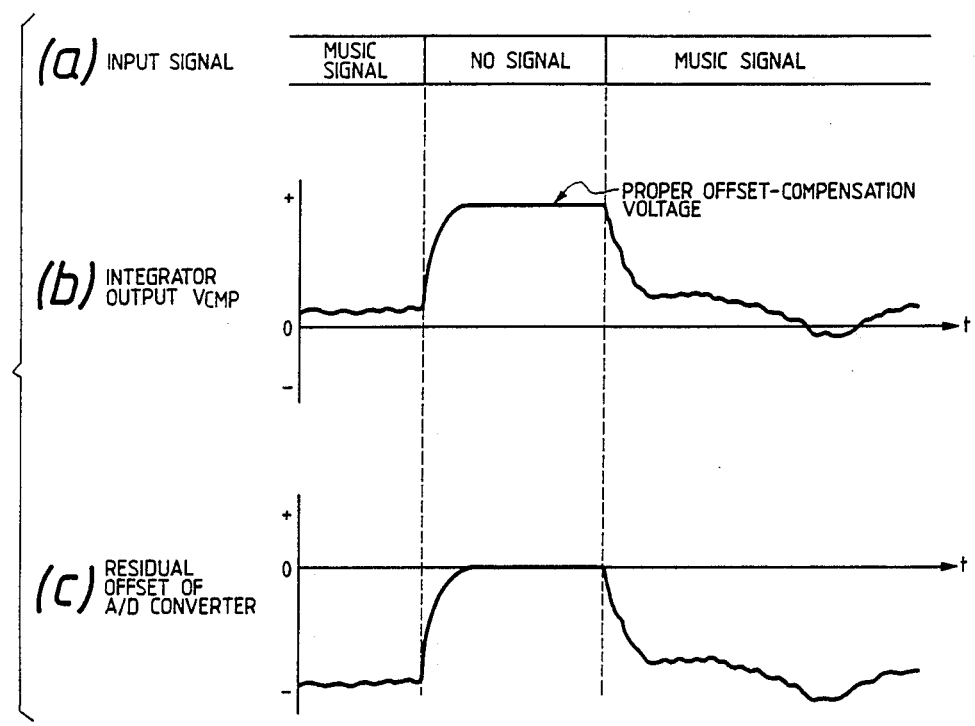
FIG. 4 shows an example of the output from the integrator of the conventional offset compensation circuit and an example of the residual offset in the A/D converter.
Figure 7:
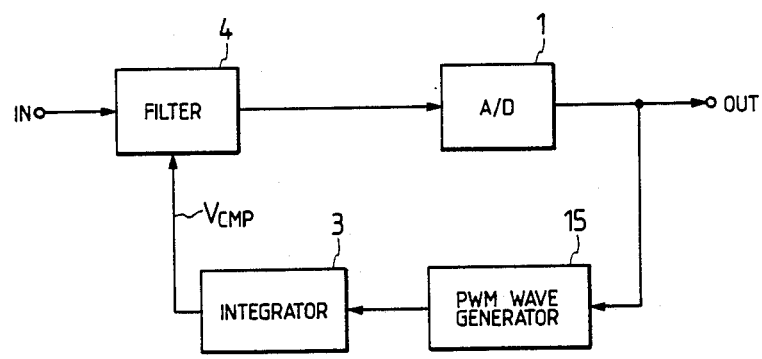
FIG. 7 shows a block diagram of an offset compensation circuit according to a first embodiment of the present invention.

FIG. 7 shows an offset compensation circuit according to a first embodiment of the present inVention which compensates an offset in a circuit line including an A/D converter 1. The offset compensation circuit includes an integrator 3 and a filter 4 which are the same as those shown in FIG. 1. According to the present invention the offset compensation circuit includes a pulse width modulation wave generator 15 between the output terminal of the A/D converter 1 and the input terminal of the integrator 3. In the generator 15, the m (a whole number) most significant bits of a digital output signal OUT generated by the A/D converter 1 are extracted from the signal so that the generator produces a pulse width modulation wave depending on the extracted m most significant bits.

Figure 8:
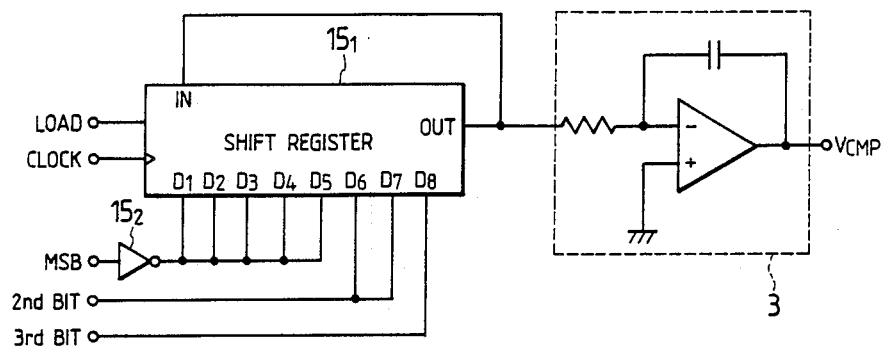
FIG. 8 shows the concrete constitution of the pulse width modulation wave generator of the offset compensation circuit shown in FIG. 7, and that of the integrator of the circuit.

FIG. 8 shows an example of the configuration of the integrator 3 and an example of the configuration of the pulse width modulation wave generator 15.

A prescribed band of an analog input signal IN is passed by the filter 4 and supplied to the A/D converter 1 which changes the signal into the digital output signal OUT. The pulse width modulation wave generator 15 produces the pulse width modulation wave depending on the m most significant bits of the digital output signal OUT. The pulse width modulation wave is supplied to the integrator 3 so that the integrator produces an offset compensation voltage $V_{CMP}$ which is fed back to the circuit line through the filter 4 to compensate the offset in the circuit line.

It is supposed herein that the digital output signal from the A/D converter 1 is made of 16 bits and two's complement, and the pulse width modulation wave is produced from the three most significant bits of the signal. The three most significant bits of the digital output signal from the A/D converter 1 are supplied to the data input terminals $D_1, D_2, D_3, D_4, D_5, D_6, D_7$ and $D_8$ of a shift register $15_1$ constituting the pulse width modulation wave generator 15 as shown in FIG. 8. At that time, only the most significant bit is inverted by an inverter $15_2$ and then supplied to the data input terminals $D_1, D_2, D_3, D_4$ and $D_5$, the second most significant bit is directly supplied to the data input terminals $D_6$ and $D_7$, and the third most significant bit is directly supplied to the data input terminal $D_8$. A data loading signal and a clock signal are also supplied to the data loading terminal LOAD and clock terminal CLOCK, respectively, of the shift register $15_1$. The most significant bit, the second most significant bit and the third most significant bit are weighted by 5, 2 and 1, respectively, so that they form the pulse width modulation wave.

Figure 9:
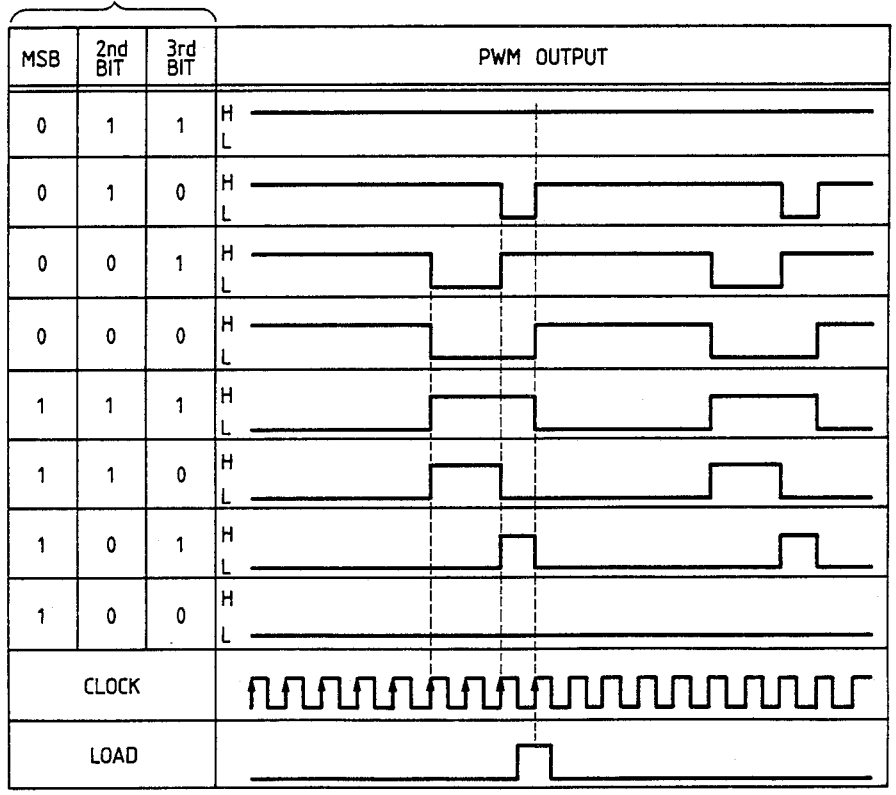
FIG. 9 shows diagrams for describing the output from the pulse width modulation wave generator.

FIG. 9 illustrates how the pulse width modulation wave generator 15 produces the pulse width modulation wave from the three most significant bits of the digital output signal from the A/D converter 1 via the above-mentioned weighting of the bits.

Figure 10:
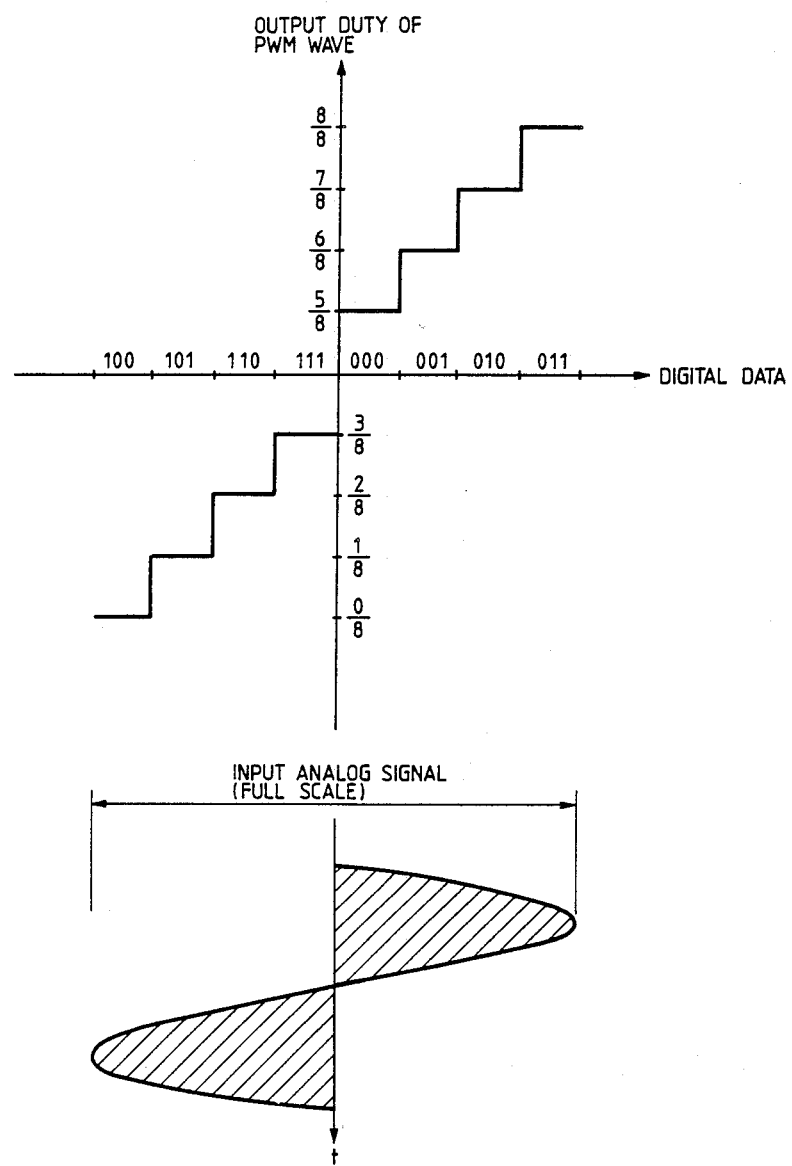
FIG. 10 shows diagrams for describing the output from the pulse width modulation wave generator.

FIG. 10 shows the duty factor of the pulse width modulation wave as it relates to the analog input signal IN. Since the three most significant bits of the digital output signal OUT produced by the A/D converter 1 are extracted from the signal, the pulse width modulation wave is generated as a control signal for eliminating the offset in the A/D converter. The duty factor of the pulse width modulation wave changes between 0/8 and 8/8 depending on the amplitude of the analog input signal, when the level of the analog input signal is equally divided into eight portions.

The pulse width modulation wave is supplied from the pulse width modulation wave generator 5 to the integrator 3, as the offset-eliminating control signal including information concerning the amplitude of the analog input signal, and is integrated by the integrator 3 so that the integrator sends out the offset compensation voltage $V_{CMP}$ which is supplied to the filter 4 to compensate the offset in the circuit line including the A/D converter 1. When the analog input signal is absent, the pulse width modulation wave generator 15 sends out a pulse width modulation wave having a ⅝ or ⅜ duty factor, depending on the quantity of the DC offset in the circuit line, as shown in FIG. 10, and the pulse width modulation wave is integrated by the integrator 3. The output of the integrator 3 is fed back to the filter 4, so that the digital output signal changes between the positive and the negative minimum values.

Although the three most significant bits of the digit output signal OUT are used to produce the pulse width modulation wave to compensate the offset in the example discussed above, the number of the most significant bits to be used for that purpose may be altered depending on the loop gain of the offset compensation circuit and the circuit line and the expected quantity of the offset.

Although the offset compensation voltage $V_{CMP}$ produced by the integrator 3 is fed back to the filter 4 in the above-described embodiment, the offset compensation voltage may be fed back to an optional section such as a sampling circuit and a simple buffer amplifier, depending on the circuit configuration of an analog part, as long as the negative feedback is achieved.

Figure 11:
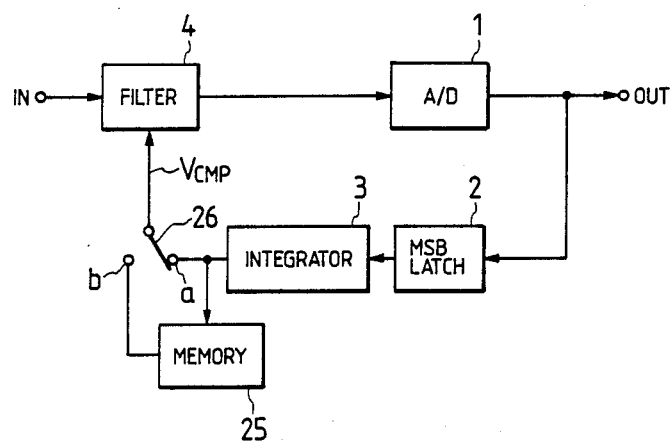
FIG. 11 shows a block diagram of an offset compensation circuit according to a second embodiment of the present invention.

FIG. 11 shows an offset compensation circuit according to a second embodiment which functions to compensate an offset in a circuit line including an A/D converter 1. The offset compensation circuit includes a most significant bit latch circuit 2, an integrator 3 and a filter 4 which are the same as those shown in FIG. 1. According to the present invention, a memory 25 is provided at the output side of the integrator for storing the level of a proper offset compensation voltage sent out from the integrator 3 when an analog input signal such as a music signal is absent, and a switch 26 is also provided for feeding back the offset compensation voltage from the integrator 3 to the circuit line through the filter 4 when the analog input signal is absent, or feeding back the stored level of the proper offset compensation voltage to the circuit line through the filter when the analog input signal is present.

Figure 12:
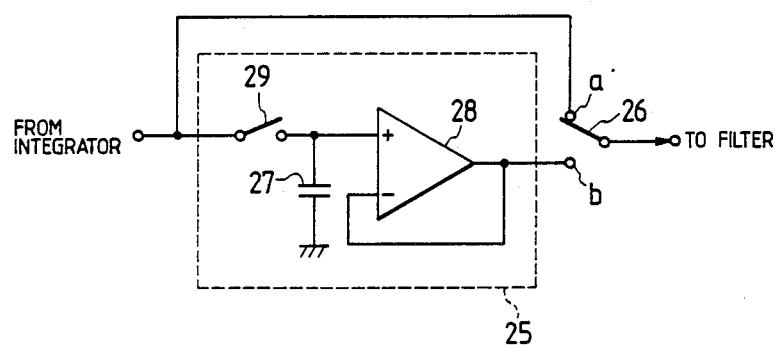
FIG. 12 shows an example of the constitution of the memory of the offset compensation circuit shown in FIG. 11.

FIG. 12 shows an example of the memory 25. The memory 25 is composed of a capacitor 27 and an operational amplifier 28 so that the level of the proper offset compensation voltage sent out from the integrator 3 when the analog input signal is absent, is stored as an analog value in the memory 25. The operation amplifier 28 constitutes a buffer amplifier. When a switch 29 is turned on, the capacitor 27 is charged at a voltage equal to the offset compensation voltage from the integrator 3. When the switch 29 is turned off after the analog input signal is no longer present, the charge of the capacitor 27 is retained for a long time because of the very high input impedance of the operational amplifier 28 and the output voltage from the operational amplifier becomes equal to the offset compensation voltage, so that the offset compensation voltage is stored in the operational amplifier.

Figure 13:
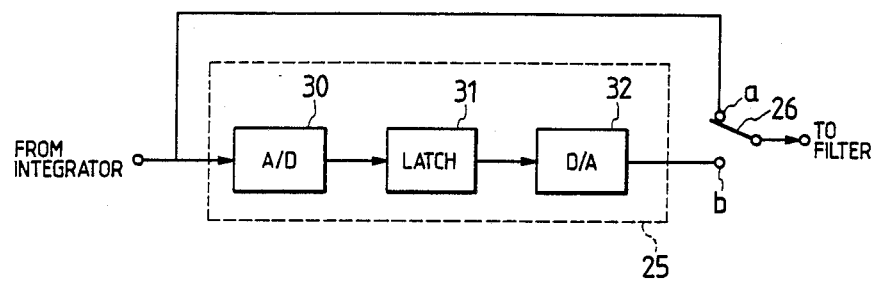
FIG. 13 shows another example of the constitution of the memory of the offset compensation circuit shown in FIG. 11.

FIG. 13 shows another example of the memory 25. This example of the memory 25 functions in such a manner so that the level of the proper offset compensation voltage from the integrator 3 is changed into a digital value which is stored in the memory 25 when the analog input signal is absent. After the level of the offset compensation voltage from the integrator 3 is changed into the digital value by an A/D converter 30, the digital value is latched by a latch circuit 31 so that the value corresponding to the level of the offset compensation voltage is stored in the memory 25. A D/A converter 32 changes the stored digital value into an analog value to be output.

In the offset compensation circuit shown in FIG. 11, only a necessary band of the analog input signal IN is passed by the filter 4 and supplied to the A/D converter 1 so that the converter sends out a digital output signal OUT. Only the most significant bit of the digital output signal OUT is detected by the most significant bit latch circuit 2 and integrated by the integrator 3 so that the integrator sends out the offset compensation voltage. When the analog input signal IN is absent, the switch 26 is connected to a contact a so that the proper offset compensation voltage from the integrator 3 is fed back to the A/D converter 1 through the filter 4 to compensate the offset in the circuit line. At the same time, the offset compensation voltage from the integrator 3 is supplied to the memory 25 and stored therein. When the analog input signal is present and applied to the circuit line, the switch 26 is connected to another contact b so that the proper offset compensation voltage stored in the memory 25 is fed back to the A/D converter 1 through the filter 4 to compensate the offset in the circuit line.

Figure 14:
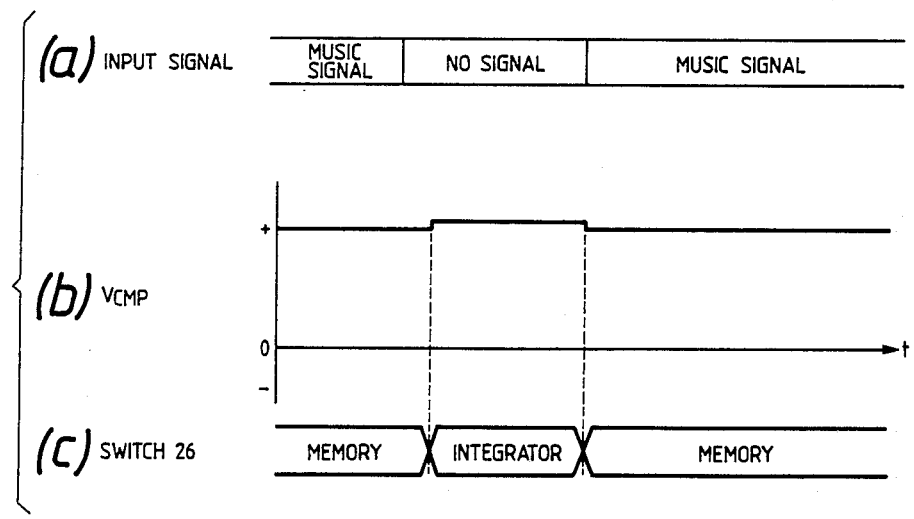
FIG. 14 shows diagrams for describing the operation of the offset compensation circuit shown in FIG. 11.

FIG. 14 illustrates the operation of the offset compensation circuit shown in FIG. 11, and indicates the analog input signal at (a), the offset compensation voltage $V_{CMP}$ at (b) and the state of the connection of the switch 26 at (c). When the analog input signal is absent, the offset compensation voltage supplied directly from the integrator 3 is selected by the switch 26 to compensate the offset in the circuit line on the basis of the offset compensation voltage. When the analog input signal is present and applied to the circuit line, the offset compensation voltage stored in the memory 25 is selected by the switch 26 to compensate the offset in the circuit line on the basis of the offset compensation voltage.

Figure 15:
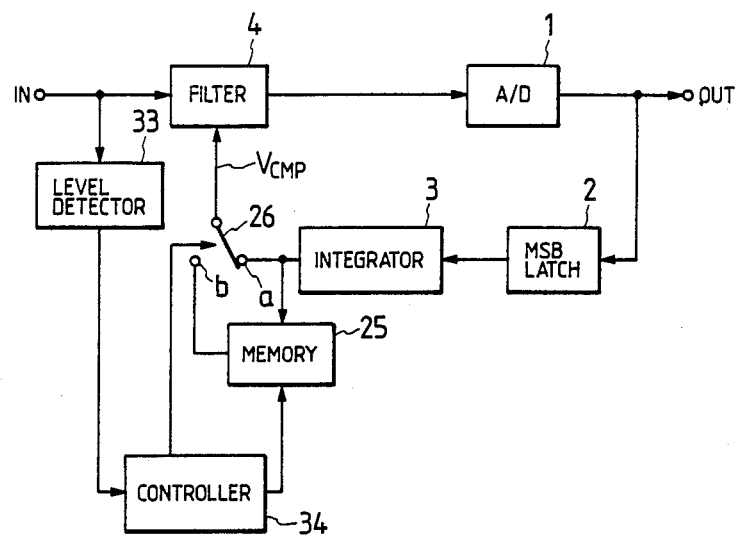
FIG. 15 shows a block diagram of an offset compensation circuit according to a third embodiment of the present invention.

FIG. 15 shows an offset compensation circuit according to a third embodiment which functions to compensate an offset in a circuit line including an A/D converter 1. The difference between the offset compensation circuit in FIG. 15 and that shown in FIG. 11 is the provision of a level detector 33 which automatically detects the absence of an analog input signal IN such as a music signal in terms of the level thereof, and a controller 34 for controlling a memory 25 and a switch 26 on the basis of the detection of the absence of the signal output from the level detector. When the absence of the analog input signal IN is detected by the level detector 33, the controller 34 sends out a storage command to the memory 25 to store the output from an integrator 3, and connects the switch 26 at a contact a. As a result, the proper offset compensation voltage outputted from the integrator 3 is stored in the memory 25 and selected by the switch 26 to compensate the offset in the circuit line on the basis of the output from the integrator when the analog input signal IN is absent. When the analog input signal is present and applied to the circuit line, the controller 34 sends out an output command to the memory 25 and acts to connect the switch 26 to contact b. As a result, the offset in the circuit line is compensated on the basis of the proper offset compensation voltage stored in the memory 25 during the absence of the analog input signal.

Figure 16:
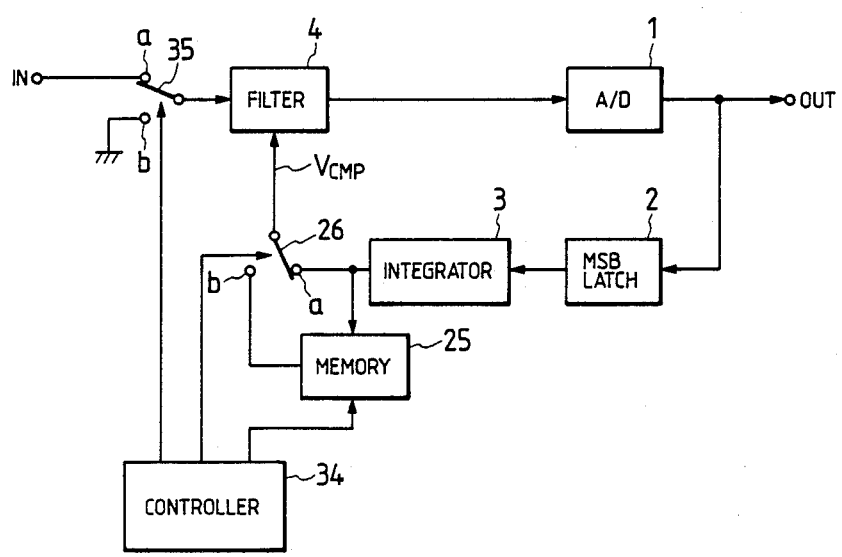
FIG. 16 shows a block diagram of an offset compensation according to a fourth embodiment of the present invention.

FIG. 16 shows an offset compensation circuit according to a fourth embodiment which functions to compensate an offset in a circuit line including an A/D converter 1. Even when an analog input signal IN to the circuit line is present, the same state as when the analog input signal is absent is established in the offset compensation circuit so that a proper offset compensation voltage is stored in a memory 25. A switch 35 provided at the input terminal of the circuit line is temporarily connected at a contact b by a controller 34 so it is set at the ground potential to establish the same state as during the absence of the analog input signal IN. The memory 25 and a switch 26 are controlled by the controller 34 in the same manner as the offset compensation circuit shown in FIG. 15. As for the offset compensation circuit shown in FIG. 16, the same proper offset compensation voltage as when the analog input signal IN is absent, can be stored in the memory 25 by forcibly setting the switch 35 at the ground potential under the control of the controller 34 at the time of start of recording, power application or the like, without waiting for the analog input signal to become absent.

Figure 17:
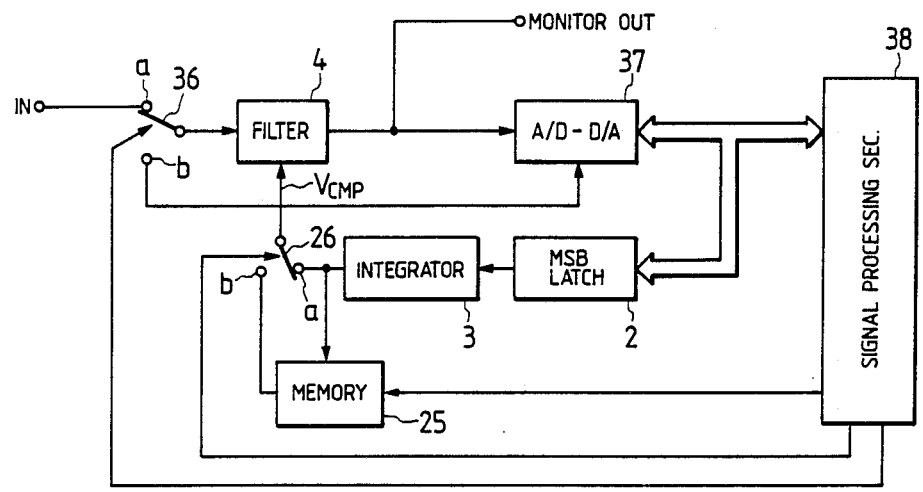
FIG. 17 shows a block diagram of an offset compensation circuit according to a fifth embodiment of the present invention.

FIG. 17 shows an offset compensation circuit according to a fifth embodiment which functions so that an offset in a circuit line including an A/D and D/A converter 37 which can perform both A/D conversion and D/A conversion is compensated as precisely as an offset in a circuit line including an A/D converter is. The offset compensation circuit includes a switch 36 which is shifted for A/D conversion or D/A conversion, a signal processing section 38 including a digital signal processor for performing signal processing along with the A/D conversion or the D/A conversion and control a memory 25, a switch 26 and the switch 36 in the A/D conversion or the D/A conversion. In the A/D conversion mode, the switch 36 is connected at a contact a under control of the signal processing section 38, and an analog input signal IN such as a music signal is supplied to the A/D and D/A converter 37 through the filter 4 and changed into a digital signal by the A/D converting section of the converter. The digital signal is subjected to necessary processing in the signal processing section 38. The polarity bit of the digital signal is supplied from a most significant bit latch circuit 2 to an integrator 3 and integrated thereby so that an offset compensation voltage is output. During the absence of the analog input signal IN to the circuit line, the proper offset compensation voltage outputted by the integrator 3 is fed back to the circuit line through the contact a of the switch 26 to compensate the offset in the circuit line, and is stored in the memory 25 under the control of the signal processing section 38. When the analog input signal IN to the circuit line is present, the switch 26 is connected at another contact b under the control of the signal processing section 38 so that the proper offset compensation voltage stored in the memory 25 during the absence of the analog input signal IN is fed back to the circuit line, instead of the output directly from the integrator 3, to compensate the offset in the circuit line as precisely as when the analog input signal is absent.

In the D/A conversion mode, the switches 26 and 36 are connected to the contacts b thereof by the signal processing section 38, a digital signal subjected to necessary processing by the signal processing section is changed into an analog signal by the D/A converting section of the A/D and D/A converter 37, and the analog signal is supplied to the filter 4 through the contact b of the switch 36 and outputted from the filter 4. At that time, the digital signal from the signal processing section 38 is also supplied to the most significant bit latch circuit 2, the output of which is supplied to the integrator 3. Since the output from the integrator 3 is determined by the digital signal to be converted into the analog signal and is independent of the offset in the A/D and D/A converter 37, the proper offset compensation voltage stored in the memory 25 during the absence of the analog input signal IN, in the previous mode of the A/D conversion, is supplied to the filter 4 through the contact b of the switch 26 in the D/A conversion mode. In other words, in the D/A conversion mode, the output directly from the integrator 3 is not used but instead the output from the memory 25 is used and no feedback to the circuit line is performed.

When the D/A conversion mode is changed to the A/D conversion mode, the proper offset compensation voltage, stored in the memory 25 during the absence of the analog input signal IN during the previous A/D conversion mode, is outputted from the memory so that a residual offset is made zero. As a result, the compensation of the offset in the circuit line in the A/D conversion mode changed from the D/A conversion mode is performed quickly.

Figure 5:
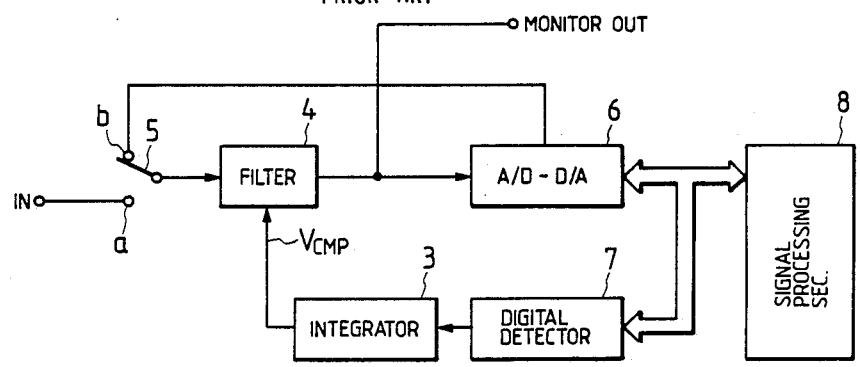
FIG. 5 shows a block diagram of another conventional offset compensation circuit for a circuit line including an A/D and D/A converter.
Figure 18:
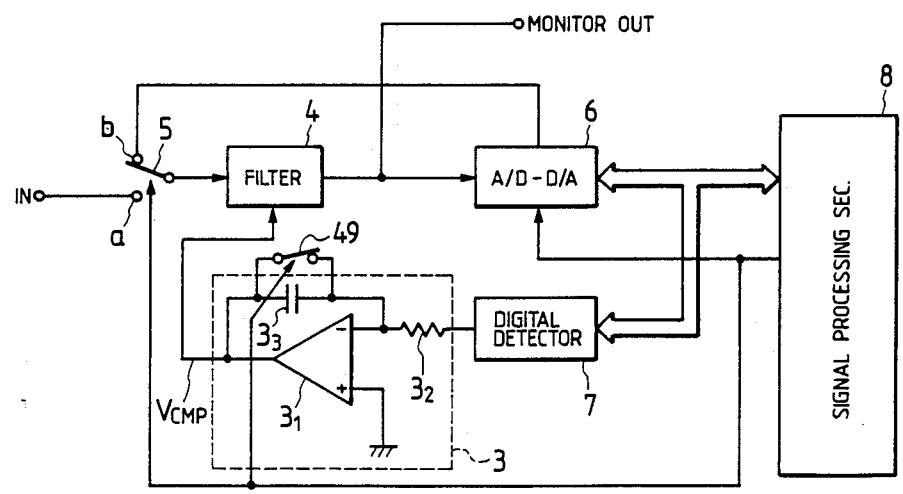
FIG. 18 shows a block diagram of an offset compensation circuit according to a sixth embodiment of the present invention.

FIG. 18 shows an offset compensation circuit according to a sixth embodiment which functions to compensate an offset in a circuit line including an A/D and D/A converter 6 which can perform both A/D conversion and D/A conversion. The mutually corresponding portions of the offset compensation circuit and the conventional offset compensation circuit shown in FIG. 5 are denoted by the same reference symbols. The offset compensation circuit shown in FIG. 18 includes an integrator 3 composed of an operational amplifier 31, an integrator resistor 32 and an integrating capacitor 33, a digital detector 7 which is a most significant bit latch circuit or a pulse width modulation wave generator, which are the same as those described in embodiments set forth above, and a switch 49 coupled in parallel with the integrating capacitor 33 to short-circuit the input and output terminals of the capacitor 33 to each other to inhibit the operation thereof.

In the A/D conversion mode, a switch 5 is connected to contact a, the A/D and D/A converter 6 is put in the A/D conversion mode, and the switch 49 is turned off, all under the control of a signal processing section 8. As a result, an analog input signal IN is applied to the circuit line through the contact a of the switch 5, and subjected to necessary band limitation by a filter 4, the output of which is supplied to the A/D and D/A converter 6 and changed into a digital signal by the A/D converting section of the converter. The digital signal is subjected to necessary processing by the signal processing section 8 and then supplied to the digital detector 7, the output from which is supplied to the integrator 3 which integrates the fluctuation in the output from the digital detector so that the integrator sends out an offset compensation voltage which is fed back to the circuit line through the filter 4 to compensate the offset in the circuit line. The analog output from the filter 4 is sent to a monitoring output terminal so as to be monitored.

In the D/A conversion mode, the switch 5 of the offset compensation circuit shown in FIG. 18 is connected at contact b, the A/D and D/A converter 6 is in the D/A conversion mode, and the switch 49 is turned on under control of the signal processing section 8. Since the switch 49 is thus turned on, the input and output terminals of the integrating capacitor 33 are short-circuited so that the operation of the integrator 3 substantially ceases. A digital signal subjected to the necessary processing by the signal processing section 8 is changed into an analog signal by the D/A converting section of the A/D and D/A converter 6. The analog signal is supplied to the filter 4 through the contact b of the switch 5. The analog output from the filter 4 is sent to the monitoring output terminal so that it may be monitored. The digital signal from the signal processing section 8 is also supplied to the digital detector 7 from which a value independent of the offset voltage in the A/D and D/A converter 6 is supplied to the integrator 3. Since the switch 49 is turned on under the control of the signal processing section 8 to short-circuit the input and output terminals of the integrating capacitor 33, the output from the integrator 3 is zero. As a result, the integrator 3 does not send out a value independent of the offset voltage in the converter 6, and feedback to the circuit line ceases in the D/A conversion mode.

Figure 6:
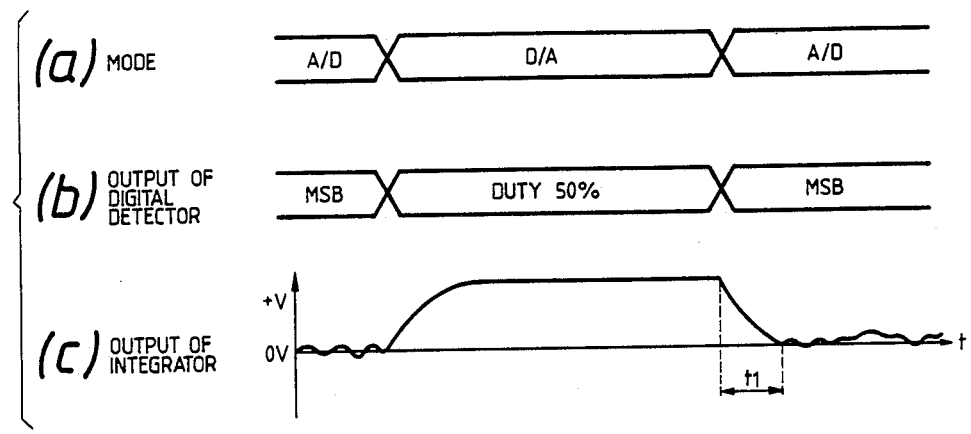
FIGS. 6(a)-(c) are diagrams for describing the problems of the conventional offset compensation circuit shown in FIG. 5.

When the D/A conversion mode is changed to the A/D conversion mode with regard to the offset compensation circuit shown in FIG. 18, the compensation of the offset is quickly started because the output from the integrator 3 in the D/A conversion mode is zero. In other words, the period $t_1$ which it takes to start the compensation of the offset, as shown in FIG. 6(c), is minimized so that the offset is precisely compensated shortly after the change from the D/A conversion mode to the A/D conversion mode.

Although the switch 49 for short-circuiting the input and output terminals of the integrating capacitor 33 to each other is provided, in the above-described embodiment, so as to inhibit the operation of the integrator 3 in the D/A conversion mode, the present invention is not confined thereto but may be altered so that turning off of the power supply to the operational amplifier 31 of the integrator 3, setting of the output terminal of the integrator at the ground potential or the like is performed in order to make the output from the integrator zero.

Figure 19:
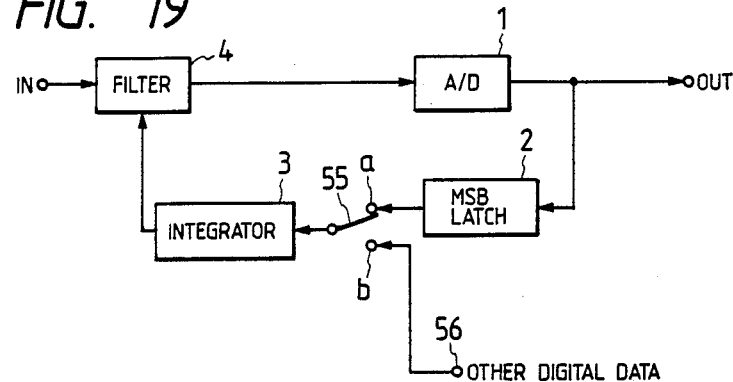
FIG. 19 shows a block diagram of an offset compensation circuit according to a seventh embodiment of the present invention.

FIG. 19 shows an offset compensation circuit according to a seventh embodiment which functions to compensate an offset in a circuit line including an A/D converter 1. The offset compensation circuit includes a most significant bit latch circuit 2, an integrator 3 and a filter 4 which are the same as those shown in FIG. 1 and form a feedback loop. According to the present invention, a changeover means such as a switch 55 is provided between the most significant bit latch circuit 2 and the integrator 3 so that the feedback loop is opened and digital data other than that obtained by the A/D converter 1 are supplied from a terminal 56 to the integrator 3, at the time of the offset adjustment of the A/D converter. In the A/D conversion mode of the A/D converter 1, the switch 55 is connected to contact a, and only a necessary band of an analog input signal IN is passed by the filter 4 and supplied to the A/D converter so that the converter sends out a digital output signal OUT which is supplied to the most significant bit latch circuit 2. Digital data obtained by the most significant bit latch circuit 2 are supplied to the integrator 3 through the contact a of the switch 55 and integrated by the integrator so that the integrator sends out an offset compensation voltage which is fed back to the circuit line through the analog signal input terminal of the filter 4 to compensate the offset in the circuit line.

In the offset adjustment mode of the A/D converter 1, the switch 55 of the offset compensation circuit shown in FIG. 19 is connected to contact b so that the feedback loop is opened and the other digital data is supplied from the terminal 56 to the integrator 3. The integrator 3 generates an offset compensation voltage on the basis of the other digital data supplied from the terminal 56, to perform the offset adjustment of the A/D converter 1, thus making the output digital code from the converter zero. In the offset adjustment mode of the A/D converter 1, a desired offset can be achieved by optionally setting the duty factor of the other digital data from the terminal 56 to the integrator 3, to thus perform the offset adjustment of the converter in such a manner as to compensate the desired offset.

The switch 55 of the offset compensation circuit shown in FIG. 19 can be made of a single gate in a digital integrate circuit including the most significant bit latch circuit 2, to open the feedback loop, at the digital integrated circuit. In that case, opening and closing the feedback loop by the switch 55 can be performed more simply and surely than in the case that the feedback loop is opened and closed in an analog section including the integrator 3 and the filter 4.

Figure 20:
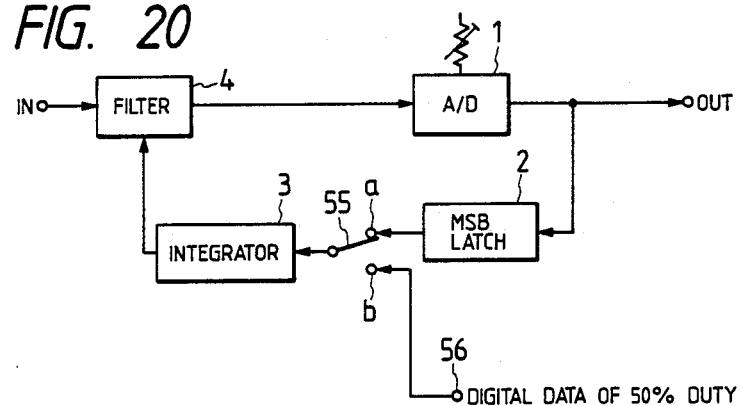
FIG. 20 shows a block diagram of an offset compensation circuit according to an eighth embodiment of the present invention.

FIG. 20 shows an offset compensation circuit according to an eighth embodiment which functions to compensate an offset in a circuit line including an A/D converter 1. As for the offset compensation circuit, the compensation of the offset by the A/D converter 1 in the A/D conversion mode is performed in the same manner as the offset compensation circuit shown in FIG. 19. In the mode of the offset adjustment of the A/D converter 1, a switch 55 is connected to a contact b so that the feedback loop of the offset compensation circuit and the circuit line is opened and digital data of 50% in duty factor is supplied from a terminal 56 to an integrator 3 through the contact b of the switch. The offset adjustment of the A/D converter 1 needs to be performed in a non-servo state established by opening the feedback loop, as mentioned above. Since supplying the digital data of 50% in duty factor to the integrator 3 is equivalent to putting the offset compensation circuit out of operation, the accuracy of the offset adjustment of the A/D converter 1 is enhanced and the offset adjustment is facilitated.

Figure 21:
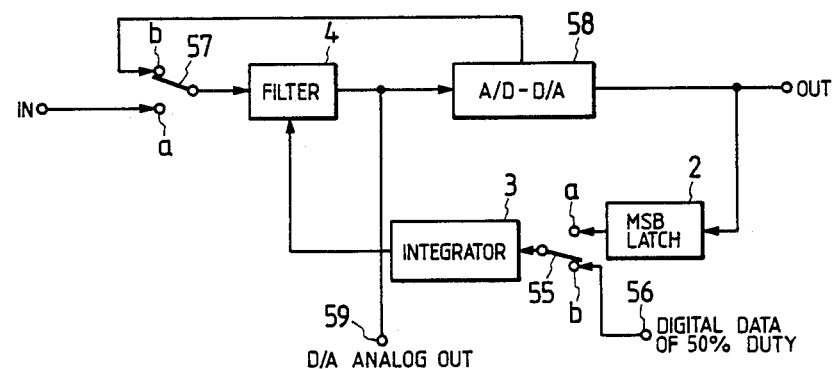
FIG. 21 shows a block diagram of an offset compensation circuit according to a ninth embodiment of the present invention.

FIG. 21 shows an offset compensation circuit according to a ninth embodiment, which functions so that an offset in a circuit line including an A/D and D/A converter 58 which can perform both A/D conversion and D/A conversion is compensated as precisely as an offset in a circuit line including an A/D converter. The offset compensation circuit includes a switch 57 which is shifted for the A/D conversion or the D/A conversion. A signal sent out from the A/D and D/A converter 58 is processed by a signal processing section (not shown in FIG. 21) made of a digital signal processor to perform signal processing along with the A/D conversion or the D/A conversion. In the A/D conversion mode, the switches 55 and 57 are connected at contacts a under control of the signal processing section, and the A/D and D/A converter 58 is put in the A/D conversion mode. As a result, an analog input signal IN is supplied to a filter 4 through the contact a of the switch 57 and subjected to a necessary band limitation by the filter 4, the output of which is changed into a digital signal by the A/D converting section of the A/D and D/A converter 58. The digital signal is subjected to a necessary processing by the signal processing section and then supplied to a most significant bit latch circuit 2. The output digital data from the most significant latch circuit 2 are supplied to an integrator 3 through the contact a of the switch 55 and integrated by the integrator so that the integrator sends out an offset compensation voltage which is fed back to the circuit line through the analog signal input terminal of the filter 4 to compensate the offset in the circuit line.

In the D/A conversion mode, the switches 55 and 57 of the offset compensation circuit shown in FIG. 21 are connected at contacts b under control of the signal processing section. As a result, digital data are subjected to necessary processing by the signal processing section and changed into an analog signal by the D/A converting section of the A/D and D/A converter 58. The analog signal is supplied to the filter 4 through the contact b of the switch 57. The analog output from the filter 4 is sent to a terminal 59. Since the switch 55 is connected at the contact b in the D/A conversion mode, as mentioned above, the feedback loop of the offset compensation circuit and the circuit line is opened and digital data of 50% in duty factor is supplied from a terminal 56 to the integrator 3 through the contact b of the switch. The reason for the supply of the digital data of 50% in duty factor from the terminal 56 to the integrator 3 is that the level of the output voltage which is fed back from the integrator to the filter 4 needs to be constant in the D/A conversion mode. The integrator 3 integrates the digital data of 50% in duty factor so that the integrator generates the output voltage whose level is constant.

The most significant bit latch circuit 2 in each of the embodiments shown in FIGS. 19, 20 and 21 may be replaced with a pulse width modulation wave generator which extracts the plural most significant bits of the digital output signal OUT and produces a pulse width modulation wave on the basis of the extracted bits.

What is claimed is:

1. An offset compensation circuit for compensating a DC offset which occurs in a circuit line including an A/D converter for sampling an analog input signal and converting each sampled value into a digital signal of n bits, comprising:
a pulse width modulation wave generator for producing a pulse width modulation wave as an offset-eliminating control signal which is calculated based on the values of the m ($1 < m \leq n$) most significant bits of said digital signal sent out from said converter;
an integrator for integrating said wave and outputting an offset compensation voltage; and
means for performing negative feedback of said offset compensation voltage to an analog section of said A/D converter to compensate for said DC offset.

2. An offset compensation circuit for compensating a DC offset which occurs in a circuit line including an A/D converter receiving an analog signal having a statistically equal probability of positive and negative polarity, said A/D converter converting said analog signal into a digital signal, comprising:
an integrator for integrating the fluctuation in said digital signal and outputting an offset compensation voltage to an analog section of said A/D converter;
a memory means for storing the level of said offset compensation voltage when said analog signal is not present; and
switch means for selecting one of said stored level and a direct output of said integrator to perform feedback to said analog signal section.

3. An offset compensation circuit for compensating a DC offset which occurs in a circuit line including an A/D and D/A converter for changing an analog input signal into a digital output signal when said A/D and D/A converter is in an A/D conversion mode and changing a digital input signal into an analog output signal when said A/D and D/A converter is in an D/A conversion mode, comprising:
an integrator for integrating the fluctuation in said digital output signal and outputting an offset compensation voltage;
means for performing feedback of said offset compensation voltage to an analog input terminal of said A/D and D/A converter; and
means for inhibiting the operation of said integrator when said A/D and D/A converter is in said D/A conversion mode.

4. An offset compensation circuit for compensating a DC offset which occurs in a circuit line including an A/D converter for sampling an analog input signal and changing said analog input signal into a digital output signal by performing quantization and encoding, comprising:
means for generating an offset compensation voltage;
feedback means for feeding said compensation voltage to an input terminal of said A/D converter; and
changeover means for selecting one of said digital output signal and digital data from an external source, said compensation voltage being generated on the basis of the output of said changeover means.

5. An offset compensation circuit as claimed in claim 4, wherein said digital data from an external source is digital data of 50% duty factor at the time of offset adjustment of the A/D converter.

6. An offset compensation circuit as claimed in claim 4, wherein said A/D converter can perform both A/D conversion and D/A conversion; and
digital data of 50% duty factor are used as the digital data from an external source in a D/A conversion mode.

7. An offset compensation circuit as claimed in claim 1, further comprising a filter means for band limiting said analog input signal.

8. An offset compensation circuit as claimed in claim 7, wherein the output of said filter is the input to said A/D converter, and said offset compensation voltage is supplied to said filter.

9. An offset compensation circuit as claimed in claim 1, wherein m=3.

10. An offset compensation circuit as claimed in claim 9, wherein the most significant bit the second most significant bit and the third most significant bit are weighted by 5, 2 and 1, respectively, to form said pulse width modulation wave.

11. An offset compensation circuit as claimed in claim 2, further comprising a most significant bit latch means disposed between said A/D converter and said integrator for holding the most significant bits of said digital signal.

12. An offset compensation circuit as claimed in claim 11, further comprising:
control means for controlling said memory means, so that said memory means stores said level of said voltage generated by said integrator, and for controlling said switch means, wherein said switch means selects said voltage from said integrator when said analog input signal is present and selects said level stored in said memory when said analog signal is absent.

13. An offset compensation circuit as claimed in claim 12, wherein said control means further controls a second switch means for selecting between said analog input signal and ground potential, wherein said control means controls said second switch to select said ground potential and said switch means to select said memory means simultaneously.

14. An offset compensation circuit as claimed in claim 12, further comprising:
level detecting means for detecting the absence of an analog input signal, wherein said control means controls said switch means based on the output of said level detecting means.

15. An offset compensation circuit as claimed in claim 12, wherein said A/D converter can perform both A/D conversion and D/A conversion.

16. An offset compensation circuit as claimed in claim 15, wherein control means inhibits the operation of said integrator when said converter is in a D/A conversion mode.

17. An offset compensation circuit as claimed in claim 3, further comprising a most significant bit latch means disposed between said A/D and D/A converter and said integrator, for holding the most significant bits of said digital signal.

18. An offset compensation circuit as claimed in claim 3, further comprising a pulse width modulation wave generator disposed between said A/D and D/A converter and said integrator.

19. An offset compensation circuit as claimed in claim 3, wherein said integrator further comprises:
an amplifier;
a capacitor connected in parallel to said amplifier; and
second switch means connected in parallel to said capacitor;
wherein said second switch means is turned off by said inhibiting means when said A/D and D/A converter is in a A/D conversion mode, and said second switch means is turned on by said inhibiting means when said A/D and D/A converter is in a D/A conversion mode, thus inhibiting the operation of the integrator in said D/A conversion mode.

20. An offset compensation circuit as claimed in claim 4, further comprising a most significant bit latch means disposed between said A/D converter and said changeover means for holding the most significant bits of said digital signal.

21. An offset compensation circuit as claimed in claim 3, further comprising changeover means for selecting one of said digital data output from said A/D and D/A converter and digital data from an external source, said compensation voltage being generated on the basis of the output of said changeover means, and
most significant bit latch means disposed between said A/D and D/A converter and said changeover means for holding the most significant bits of said digital signal.

22. An offset compensation circuit as claimed in claim 21, wherein said digital data from an external source is digital data of 50% duty factor at the time of offset adjustment of the A/D and D/A converter.

23. An offset compensation circuit as claimed in claim 1, wherein said m bits include a polarity bit and at least one bit corresponding to an amplitude of said analog input signal.

* * * * *